(12) United States Patent
Wu et al.

(10) Patent No.: US 8,162,038 B2
(45) Date of Patent: Apr. 24, 2012

(54) HEAT SINK ASSEMBLY

(75) Inventors: Yi-Qiang Wu, Shenzhen (CN);
Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 933 days.

(21) Appl. No.: 12/185,125

(22) Filed: Aug. 4, 2008

(65) Prior Publication Data
US 2010/0025012 A1     Feb. 4, 2010

(51) Int. Cl.
*H05K 7/20* (2006.01)
(52) U.S. Cl. .............. 165/104.33; 165/121; 361/697; 361/700
(58) Field of Classification Search ............ 165/104.33, 165/121; 361/700, 697
See application file for complete search history.

(56) References Cited

U.S. PATENT DOCUMENTS

| | | | |
|---|---|---|---|
| 6,625,021 B1 * | 9/2003 | Lofland et al. | 361/697 |
| 6,938,682 B2 * | 9/2005 | Chen et al. | 165/104.33 |
| 7,147,435 B2 * | 12/2006 | Lien et al. | 415/213.1 |
| 7,174,951 B1 * | 2/2007 | Lin | 165/104.33 |
| 7,874,348 B2 * | 1/2011 | Liu et al. | 165/121 |
| 2007/0091568 A1 * | 4/2007 | Chen et al. | 361/696 |
| 2007/0139886 A1 * | 6/2007 | Xia et al. | 361/700 |
| 2007/0165374 A1 * | 7/2007 | Chen et al. | 361/687 |

FOREIGN PATENT DOCUMENTS
CN          2618300 Y       5/2004
* cited by examiner

*Primary Examiner* — Leonard R Leo
(74) *Attorney, Agent, or Firm* — Altis Law Group, Inc.

(57) ABSTRACT

A heat sink assembly includes a base, a fin group located at a top of the base, a heat pipe connecting the base with the fin group, a fan mounted on a side of the fin group and a supporting bracket mounted on the base and supporting the fan. The supporting bracket includes a mounting portion secured on the base and a pair of supporting arms extending from the mounting portion and fixed to the fan. Four screws extend through the fan to threadedly engage with the fin group. Lower two of the screws also extend through the supporting arms of the supporting bracket whereby the supporting bracket also connects with the fan.

17 Claims, 3 Drawing Sheets

HEAT SINK ASSEMBLY

BACKGROUND

1. Field of the Invention

The present invention relates to a heat sink assembly, and more particularly to a heat sink assembly having a supporting bracket to reinforce the whole strength of the heat sink assembly.

2. Description of Related Art

Nowadays, numerous heat sinks are used to dissipate heat generated by electronic devices. A tower type heat sink is a common structure of the heat sinks. The tower type heat sink generally comprises a base, a plurality of fins parallel to the base and a plurality of heat pipes mechanically and thermally connecting the base and the fins together. A fan is mounted on a side of the fins. The heat sink and the fan are supported only by the heat pipes. Thus, the heat pipes are prone to becoming deformed when subjected to shock or vibration during drop test, transportation or use.

Thus, it is desired to devise a heat sink assembly which has a strengthened structure to improve shock resistance thereof.

SUMMARY OF THE INVENTION

A heat sink assembly includes a base, a fin group located at a top of the base, a heat pipe connecting the base and the fin group together, a fan mounted on a side of the fin group and a supporting bracket mounted on the base and supporting the fan. The supporting bracket includes a mounting portion secured on the base and a pair of supporting arms extending from the mounting portion and fixed to the fan via two screws which extend through the fan to mount the fan to the fin group.

Other advantages and novel features will become more apparent from the following detailed description of preferred embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
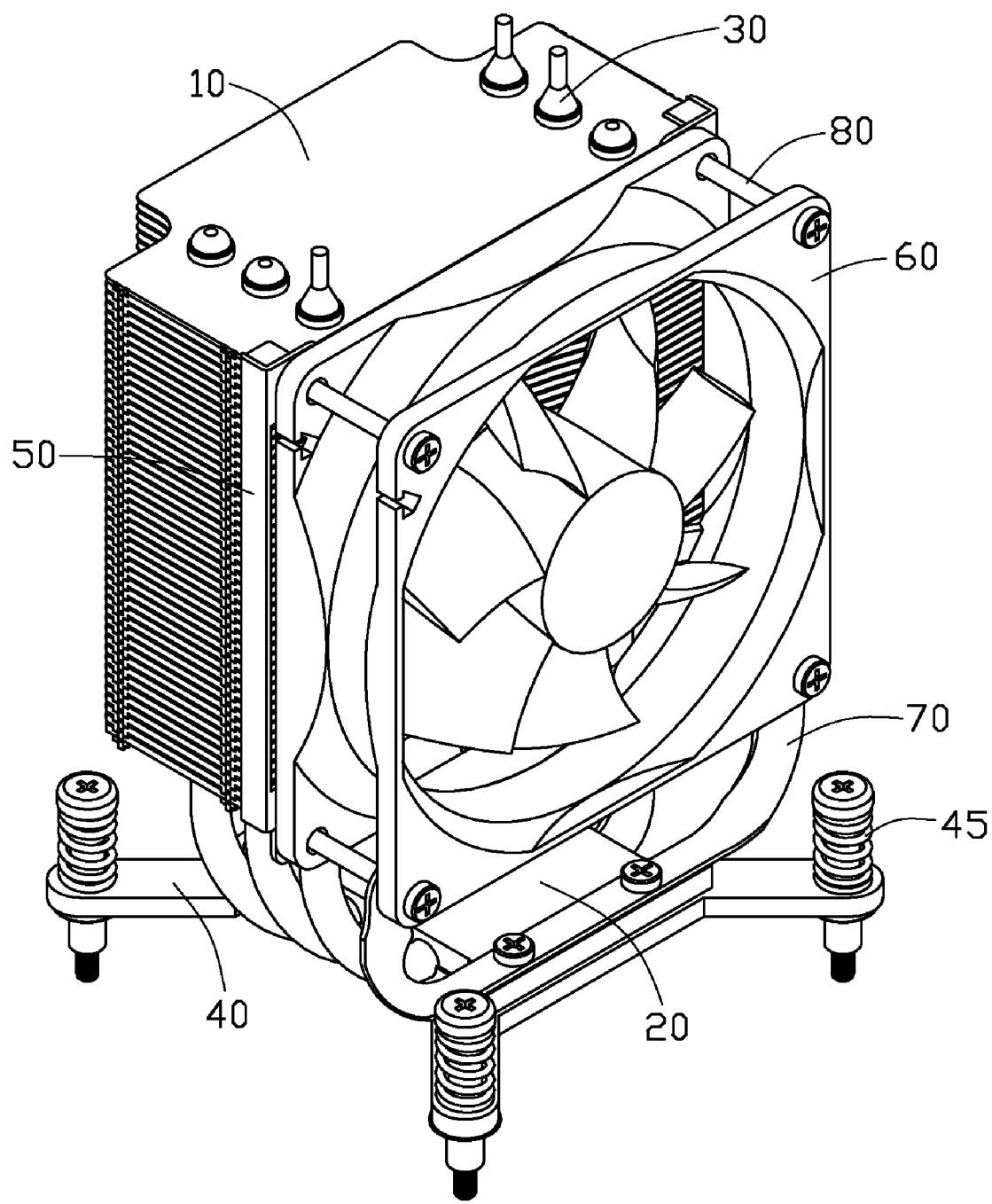
FIG. 1 is an assembled view of a heat sink assembly in accordance with a preferred embodiment of the present invention.
Figure 2:
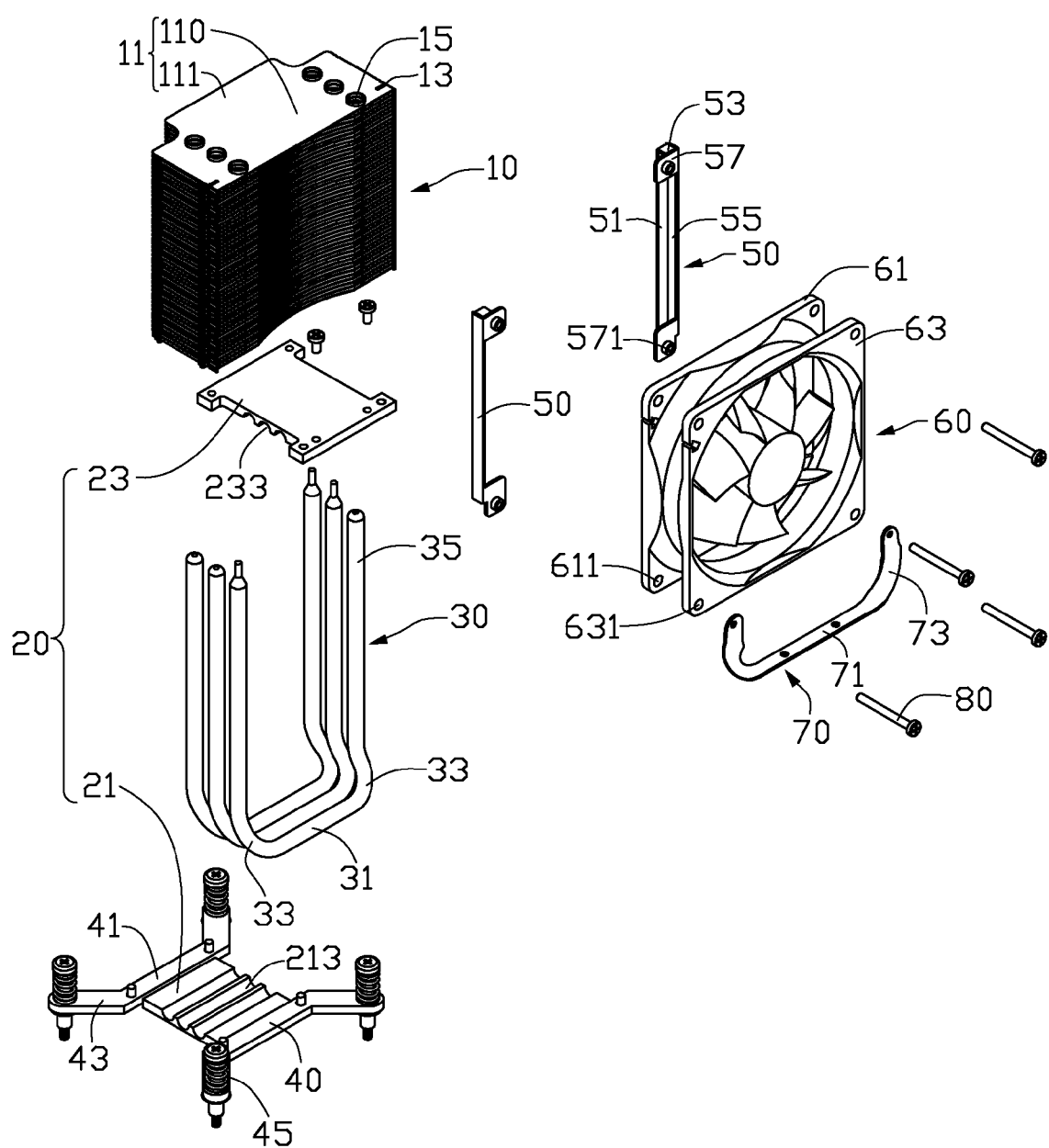
FIG. 2 is an exploded view of FIG. 1.
Figure 3:
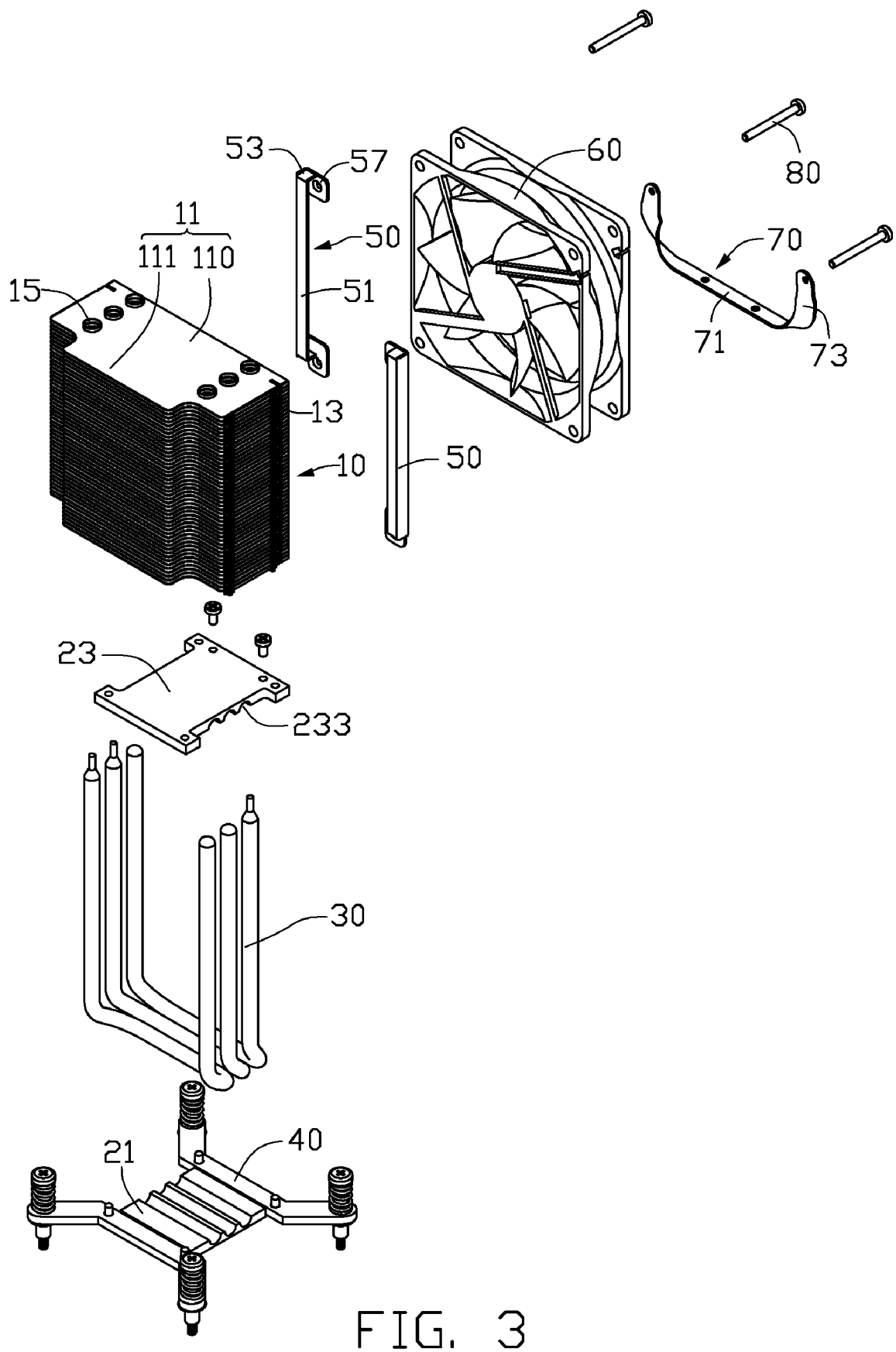
FIG. 3 is an exploded view of FIG. 1, but shown from another aspect.

Referring to FIGS. 1-2, a heat sink assembly is used to dissipate heat generated by an electronic component (not shown) mounted on a printed circuit board. The heat sink assembly comprises a base 20 contacting with the electronic component, a fin group 10 located at a top of the base 20, three U-shaped heat pipes 30 connecting with the base 20 and the fin group 10, a fan 60 mounted on a front side of the fin group 10, and a supporting bracket 70 mounted on the base 20 and abutting against and connecting with the fan 60.

The fin group 10 comprises a plurality of parallel T-shaped fins 11. Each fin 11 comprises a rectangular body 110 and a rectangular extending portion 111 extending from a centre of a rear edge of the body 110. The extending portion 111 is smaller than the body 110. Each fin 11 forms a pair of clasps (not labeled) at lateral edges of the body 10 to clasp an adjacent fin 11 therebelow. Each fin 11 defines three pair of through holes 15 at lateral ends of the body 110 to receive the heat pipes 30 in the through holes 15. The fin group 10 defines two slots 13 at lateral ends thereof to engagingly receive a pair of fan holders 50.

Each heat pipe 30 comprises a horizontal evaporation portion 31, a pair of bended connecting portions 33 extending upwardly from opposite ends of the evaporation portion 31 respectively, and a pair of vertical condensing portions 35 extending upwardly from the connecting portions 33 respectively. The condensing portions 35 extend through the through holes 15 of the fins 11 of the fin group 10 and are soldered to the fins 11. Thus, the fin group 10 and the condensing portions 35 are combined together. A bottom fin 11 of the fin group 10 abuts against the connecting portions 33 of the heat pipes 30 and is spaced from the base 20.

The base 20 is secured on the printed circuit board by a pair of mounting brackets 40. The base 20 comprises a supporting plate 21 and an engaging plate 23 engaging with a top of the supporting plate 21. The supporting plate 21 and engaging plate 23 are made of metallic material such as copper and each have a substantially rectangular configuration. The supporting plate 21 defines three parallel grooves 213 at a center portion of a top surface thereof. The engaging plate 23 defines three parallel grooves 233 of a bottom surface thereof, corresponding to the grooves 213 of the supporting plate 21. The engaging plate 23 and the supporting plate 21 defines three passages (not labeled) by the grooves 233, 213 to receive the evaporating portions 31 of the heat pipes 30 in the passages. The bottom fin 11 of the fin group 10 is spaced from a top surface of the engaging plate 23.

The mounting brackets 40 engage with front and rear ends of the supporting plate 21 of the base 20. Each mounting bracket 40 comprises an elongated mounting lever 41 engaging with the supporting plate 21 and a pair of arms 43 extending slantwise from opposite ends of the mounting lever 41. A pair of fasteners 45 extend through the arms 43 to secure the base 20 on the printed circuit board.

The fan holders 50 are mounted on the front side of the fin group 10. Each fan holder 50 is a bended metal sheet. The fan holder 50 comprises an elongated inserting plate 51, a baffling plate 55 perpendicularly extending from a longer edge of the inserting plate 51, a pair of mounting plates 57 perpendicularly extending from top and bottom ends of a longer edge of the baffling plate 55 respectively, and a pair of tabs 53 perpendicularly extending from top and bottom ends of the inserting plate 51 and connecting with the mounting plates 57 respectively. The inserting plates 51 of the fan holders 50 are inserted in the slots 13 of the fin group 10. The baffling plates 55 baffle lateral sides of the fin group 10. The tabs 53 abut against top and bottom ends of the fin group 10. The mounting plates 57 are located at the front side of the fin group 10. Each mounting plate 57 defines a mounting hole 571 therein to threadedly receive elongated screws 80 to mount the fan 60 on the fan holders 50.

The fan 60 is located at the front side of the fin group 10 and a bottom portion of the fan 60 is spaced from the engaging plate 23 of the base 20. The fan 60 has a rectangular configuration and comprises a front and rear flanges 63, 61. Each corner of the front flange 63 defines a through hole 631. Each corner of the rear flange 61 defines a through hole 611. Four elongated screws 80 extend through the through holes 631, 611 of the front and rear flanges 63, 61 in series and engage with the mounting holes 571 of the mounting plates 57 of the fan holders 50 to mount the fan 60 on the fan holders 50.

The supporting bracket 70 is a bended metal sheet and has a U-shaped configuration. The supporting bracket 70 comprises an elongated mounting portion 71 and a pair of supporting arms 73 extending upwardly from lateral ends of the mounting portion 71. Two screws (not labeled) extend through the mounting portion 71 and engage with a front end of the engaging plate 23 of the base 20 to secure the supporting bracket 70 on the base 20. The supporting arms 73 are located between the rear and front flanges 61, 63 of the fan 60 and abut against the front flange 63. Two of the elongated screws 80 extending through lower ones of the through holes 611, 631 also extend through top portions of the supporting arms 73. Thus, the supporting bracket 70 supports the fan 60 and reinforces the whole strength of the heat sink assembly.

It is believed that the present embodiments and their advantages will be understood from the foregoing description, and it will be apparent that various changes may be made thereto without departing from the spirit and scope of the invention or sacrificing all of its material advantages, the examples hereto described merely being preferred or exemplary embodiments of the invention.

What is claimed is:

1. A heat sink assembly for dissipating heat generated by an electronic component mounted on a printed circuit board, the heat sink assembly comprising:
   a base adapted for contacting the electronic component;
   a fin group located above a top of the base;
   a heat pipe connecting with the base and the fin group;
   a fan mounted on a side of the fin group, the fan comprising a front flange and a rear flange spaced from the front flange; and
   a supporting bracket comprising a mounting portion secured on the base and a pair of supporting arms extending from the mounting portion and fixed to the fan, and the supporting arms being located between the front and rear flanges,
   wherein a plurality of elongated screws extend through the front flange of the fan, the supporting arms of the supporting bracket, and the rear flange of the fan in sequence to connect to the fin group, thereby connecting the fan, the fin group and the supporting bracket together.

2. The heat sink assembly as claimed in claim 1, wherein the supporting bracket is a bended metal sheet and has a U-shaped configuration, and the supporting arms extend from opposite ends of the mounting portion.

3. The heat sink assembly as claimed in claim 1, wherein the supporting arms are located between lower portions of the front and rear flanges and abut against the lower portion of the front flange.

4. The heat sink assembly as claimed in claim 3, wherein the fan is spaced from the base.

5. The heat sink assembly as claimed in claim 1 further comprising a fan holder connecting the fin group with the fan.

6. The heat sink assembly as claimed in claim 5, wherein the fan holder comprises an inserting plate engaging with the fin group, and a pair of mounting plates extending from the inserting plate and located at a front side of the fin group, the fan engaging with the mounting plates.

7. The heat sink assembly as claimed in claim 6, wherein the fan holder further comprises a baffling plate extending from a longer edge of the inserting plate to baffle a lateral side of the fin group, a pair of tabs extending from top and bottom ends of the inserting plate to abut against top and bottom ends of the fin group, the mounting plates being located at top and bottom ends of a longer edge of the baffling plate, the tabs connecting with the inserting plate and the mounting plates.

8. The heat sink assembly as claimed in claim 1, wherein the heat pipe comprises an evaporating portion received in the base, a pair of condensing portions extending through the fin group, and a pair of connecting portions extending from opposite ends of the evaporating portion and interconnecting the evaporating portion and the condensing portions.

9. The heat sink assembly as claimed in claim 8, wherein the fin group abuts against the connecting portions and is spaced from the base.

10. The heat sink assembly as claimed in claim 8, wherein the base comprises a supporting plate and an engaging plate mounted on a top of the supporting plate, and the evaporating portion of the heat pipe is sandwiched between the supporting plate and the engaging plate.

11. A heat sink assembly comprising:
    a base;
    a plurality of fins mounted over the base and parallel to the base;
    a plurality of U-shaped heat pipes each having a horizontal portion connecting with the base and two vertical portions extending upwardly from two ends of the horizontal portion and connecting with the plurality of fins;
    a fan mounted over the base and in front of the fins, the fan comprising a front flange and a rear flange spaced from the front flange;
    a plurality of screws extending through the front and rear flanges of the fan to mount the fan to a front side of the fins; and
    a supporting bracket having a lower portion connected to the base and an upper portion located between the front and rear flanges of the fan, the upper portion defining a hole which at least one of the plurality of screws extends.

12. The heat sink assembly as claimed in claim 11, wherein the supporting bracket has a U-shaped configuration, and there are two of the screws extending through the upper portion of the supporting bracket.

13. The heat sink assembly as claimed in claim 11, wherein the upper portion of the supporting bracket abuts against the front flange.

14. The heat sink assembly as claimed in claim 13: wherein the lower portion of the supporting bracket is an elongated strip and the upper portion are two spaced tabs extending from opposite ends of the strip.

15. The heat sink assembly as claimed in claim 11 further comprising a fan holder connecting the fin group with the fan.

16. The heat sink assembly as claimed in claim 15, wherein the fan holder comprises an inserting plate engaging with the fin group, and a pair of mounting plates extending from the inserting plate and being located at a front side of the fin group, the fan engaging with the mounting plates.

17. The heat sink assembly as claimed in claim 16, wherein the fan holder further comprises a baffling plate extending from a longer edge of the inserting plate to baffle a lateral side of the fin group, a pair of tabs extending from top and bottom ends of the inserting plate to abut against top and bottom ends of the fin group, the mounting plates being located at top and bottom ends of a longer edge of the baffling plate, the tabs connecting with the inserting plate and the mounting plates.

* * * * *